United States Patent
Feng et al.

(10) Patent No.: US 11,763,726 B2
(45) Date of Patent: Sep. 19, 2023

(54) DISPLAY APPARATUS, GATE ELECTRODE DRIVER CIRCUIT, SHIFT REGISTER CIRCUIT AND DRIVE METHOD THEREOF

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/424,482

(22) PCT Filed: Sep. 28, 2020

(86) PCT No.: PCT/CN2020/118411
§ 371 (c)(1),
(2) Date: Jul. 20, 2021

(87) PCT Pub. No.: WO2021/063314
PCT Pub. Date: Apr. 8, 2021

(65) Prior Publication Data
US 2022/0223096 A1    Jul. 14, 2022

(30) Foreign Application Priority Data
Sep. 30, 2019 (CN) .......................... 201910940614.0

(51) Int. Cl.
G09G 3/3266 (2016.01)
G09G 3/20 (2006.01)
G11C 19/28 (2006.01)

(52) U.S. Cl.
CPC ............ G09G 3/2092 (2013.01); G11C 19/28 (2013.01); G09G 2300/0426 (2013.01); G09G 2310/0286 (2013.01); G09G 2310/061 (2013.01)

(58) Field of Classification Search
CPC ......... G09G 3/2092; G09G 2300/0426; G09G 2310/0286; G09G 2310/061; G09G 3/3266; G09G 3/3677; G11C 19/28
See application file for complete search history.

(56) References Cited

U.S. PATENT DOCUMENTS 10,810,963 B2 * 10/2020 Zhang ................. G09G 3/3677
2004/0100485 A1 * 5/2004 Allport .............. H04N 21/4438
715/721

(Continued)

FOREIGN PATENT DOCUMENTS

CN    102654982 A    9/2012
CN    102723064 A    10/2012
(Continued)

OTHER PUBLICATIONS

CN201910940614.0 first office action and search report.
CN201910940614.0 second office action.

*Primary Examiner* — Jose R Soto Lopez
(74) *Attorney, Agent, or Firm* — IPRO, PLLC

(57) ABSTRACT

A shift register circuit includes: an input sub-circuit connected to a first node, and configured to receive a first control signal, and cause a potential of the first node to jump from an initial potential to a first potential greater than the initial potential; an output sub-circuit connected to the first node, and configured to receive a first clock signal, generate an output signal, cause the potential of the first node to jump from the first potential to a third potential greater than the first potential; and a chamfering sub-circuit connected to the first node, and configured to receive a second control signal, (Continued)

cause the potential of the first node to gradually decrease from the third potential to a fourth potential greater than the initial potential and less than the third potential, and cause the potential of the first node to jump from the fourth potential to the initial potential.

13 Claims, 6 Drawing Sheets

(56) References Cited

U.S. PATENT DOCUMENTS

| | | | | |
|---|---|---|---|---|
| 2010/0225621 | A1* | 9/2010 | Jung | G09G 3/3677 |
| | | | | 345/204 |
| 2012/0293401 | A1* | 11/2012 | Li | G11C 19/28 |
| | | | | 345/100 |
| 2014/0219412 | A1* | 8/2014 | Chien | G11C 19/28 |
| | | | | 377/68 |
| 2017/0213514 | A1* | 7/2017 | Xie | G09G 3/3225 |
| 2019/0080661 | A1* | 3/2019 | Zhao | G11C 19/28 |
| 2019/0318796 | A1* | 10/2019 | Xiong | G11C 19/28 |
| 2020/0027515 | A1* | 1/2020 | Gu | G09G 3/3677 |

FOREIGN PATENT DOCUMENTS

| | | |
|---|---|---|
| CN | 103366822 A | 10/2013 |
| CN | 105513552 A | 4/2016 |
| CN | 107342038 A | 11/2017 |
| CN | 107393499 A | 11/2017 |
| CN | 109523969 A | 3/2019 |
| CN | 110660444 A | 1/2020 |
| EP | 2725581 A1 | 4/2014 |

* cited by examiner

DISPLAY APPARATUS, GATE ELECTRODE DRIVER CIRCUIT, SHIFT REGISTER CIRCUIT AND DRIVE METHOD THEREOF

CROSS REFERENCE TO RELEVANT APPLICATIONS

The present application claims priority to Chinese patent application No. CN201910940614.0 filed on Sep. 30, 2019, the entire content of which is incorporated herein by reference.

TECHNICAL FIELD

The present disclosure relates to the field of display technology; in particular, the present disclosure relates to a display device, a gate drive circuit, a shift register circuit, and a drive method for a shift register circuit.

BACKGROUND

In the field of display technology, especially in liquid crystal display (LCD) and organic light emitting diode (OLED) display, a gate driver on array (GOA) circuit is an effective means of reducing poor display of panels and lowering cost.

SUMMARY

The present disclosure provides a shift register circuit, which includes: an input sub-circuit, which is connected to a first node of the shift register circuit, and which is configured to receive a first control signal, and cause a potential of the first node to jump from an initial potential to a first potential according to the first control signal, the first potential being greater than the initial potential; an output sub-circuit, which is connected to the first node of the shift register circuit, and which is configured to receive a first clock signal, and according to the first clock signal and the potential of the first node, generate an output signal and cause the potential of the first node to jump from the first potential to a third potential, the third potential being greater than the first potential; and a chamfering sub-circuit, which is connected to the first node of the shift register circuit, and which is configured to receive a second control signal, cause the potential of the first node to gradually decrease from the third potential to a fourth potential according to the second control signal so that a potential of the output signal gradually decreases, and cause the potential of the first node to jump from the fourth potential to the initial potential according to a third control signal, the fourth potential being greater than the initial potential and less than the third potential.

In some embodiments, the input sub-circuit comprises: a first transistor, wherein a gate of the first transistor is connected for receiving the first control signal, a first electrode of the first transistor is connected to the gate of the first transistor, and a second electrode of the first transistor is connected to the first node.

In some embodiments, the output sub-circuit comprises: a second transistor, wherein a gate of the second transistor is connected to the first node, a first electrode of the second transistor is connected for receiving the first clock signal, and a second electrode of the second transistor serves as an output terminal of the shift register circuit for outputting the output signal; and a first capacitor, wherein one terminal of the first capacitor is connected to the gate of the to second transistor, and another terminal of the first capacitor is connected to the second electrode of the second transistor.

In some embodiments, the chamfering sub-circuit comprises: a third transistor, wherein a gate of the third transistor is connected for receiving the second control signal, a first electrode of the third transistor is connected for receiving a first reference voltage, and a second electrode of the third transistor is connected to the first node; a fourth transistor, wherein a gate of the fourth transistor is connected for receiving the third control signal, a first electrode of the fourth transistor is connected to the first node, and a second electrode of the fourth transistor is connected for receiving a second reference voltage; a fifth transistor, wherein a first electrode and a gate of the fifth transistor are both connected to the first electrode of the third transistor; a sixth transistor, wherein a gate of the sixth transistor is connected to the first node, a first electrode of the sixth transistor is connected to the second electrode of the fifth transistor to form a second node, and a second electrode of the sixth transistor is connected for receiving the second reference voltage; and a seventh transistor, wherein a gate of the seventh transistor is connected to the second node, a first electrode of the seventh transistor serves as an output terminal of the shift register circuit, and a second electrode of the seventh transistor is connected for receiving the second reference voltage.

In some embodiments, the chamfering sub-circuit further comprises: an eighth transistor, wherein a gate of the eighth transistor is connected to the second node, a first electrode of the eighth transistor is connected to the first node, and a second electrode of the eighth transistor is connected for receiving the second reference voltage.

In some embodiments, the output sub-circuit further comprises a ninth transistor, wherein a gate of the ninth transistor is connected to the first node, a first electrode of the ninth transistor is connected for receiving a second clock signal, and a second electrode of the ninth transistor serves as a control output terminal of the shift register circuit for outputting a control output signal of the shift register circuit; and the chamfering sub-circuit further comprises a tenth transistor, wherein a gate of the tenth transistor is connected to the second node, a first electrode of the tenth transistor is connected to the second electrode of the ninth transistor, and a second electrode of the tenth transistor is connected for receiving the second reference voltage.

In some embodiments, further comprising a reset sub-circuit, wherein the reset sub-circuit comprises: an eleventh transistor, wherein a gate of the eleventh transistor is connected for receiving a reset signal, a first electrode of the eleventh transistor is connected to the first node, and a second electrode of the eleventh transistor is connected for receiving the second reference voltage.

In some embodiments, the chamfering sub-circuit is configured to cause the potential of the output signal to decrease gradually during a period in which the first clock signal and the second control signal are both at a high potential.

The present disclosure further provides a shift register circuit, which is used to drive the above shift register circuit, the method comprises: in a first time period, receiving, by the input sub-circuit, the first control signal, and causing the potential of the first node to jump from the initial potential to the first potential according to the first control signal, the first potential being greater than the initial potential; in a second time period, receiving, by the output sub-circuit, the first clock signal, generating the output signal and causing the potential of the first node to jump from the first potential to the third potential according to the first clock signal and the potential of the first node, the third potential being greater than the first potential; in a third time period, receiving, by the chamfering sub-circuit, a second control signal, and causing the potential of the first node to gradually decrease from the third potential to the fourth potential according to the second control signal, so that the potential of the output signal generated by the output sub-circuit according to the first clock signal and the potential of the first node gradually decreases; and in a fourth time period, receiving, by the chamfering sub-circuit, the third control signal, and causing the potential of the first node to jump from the fourth potential to the initial potential according to the third control signal, the fourth potential being less than the third potential and greater than the initial potential.

The present disclosure further provides a gate drive circuit, the gate drive circuit comprises multiple stages of shift register circuits, wherein the above shift register circuit is used as each stage of shift register circuit.

In some embodiments, the first control signal, the second control signal and the third control signal of the $N^{th}$-stage of shift register circuit are the control output signals of the $(N-4)^{th}$-stage of shift register circuit, the $(N+3)^{th}$-stage of shift register circuit and the $(N+8)^{th}$-stage of shift register circuit, respectively, where N is an integer larger than 4.

The present disclosure further provides a display device, wherein the display device comprises the above gate drive circuit.

DETAILED DESCRIPTION

Embodiments of the present disclosure will be described in detail below. Examples of the embodiments are shown in the accompanying drawings, and identical or similar elements or elements with identical or similar functions are denoted by identical or similar reference signs throughout the drawings. The embodiments described below with reference to the drawings are illustrative and are intended for interpreting the present disclosure, and they shall not be construed as limiting the present disclosure.

Figure 1:
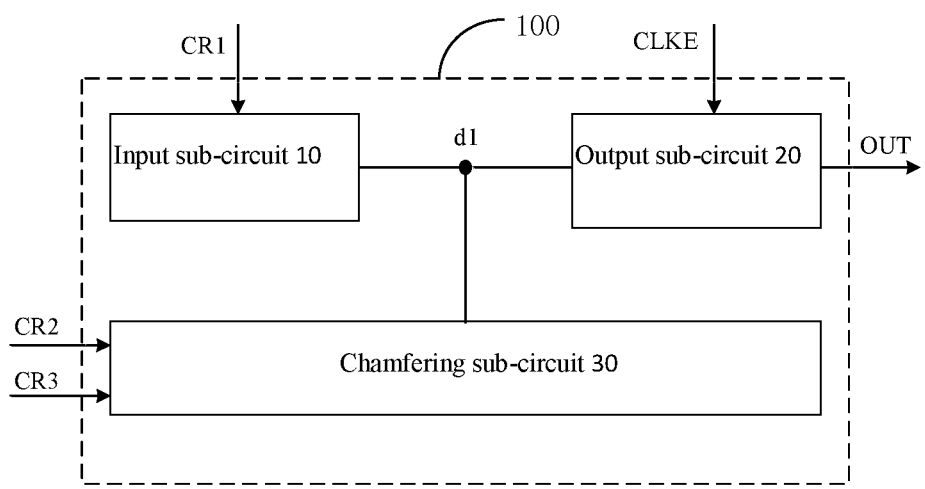
FIG. 1 is a structural block diagram of a shift register circuit according to an embodiment of the present disclosure.

FIG. 1 is a structural block diagram of a shift register circuit according to an embodiment of the present disclosure.

As shown in FIG. 1, the shift register circuit 100 includes an input sub-circuit 10, an output sub-circuit 20 and a chamfering sub-circuit 30, each of which is connected to a first node d1. The input sub-circuit 10 is configured to receive a first control signal CR1, and cause a potential of the first node d1 to jump from an initial potential V0 to a first potential V1 according to the first control signal CR1, in which the first potential V1 is greater than the initial potential V0; the chamfering sub-circuit 30 is configured to receive a second control signal CR2, cause the potential of the first node d1 to gradually decrease to a second potential V2 according to the second control signal CR2, receive a third control signal CR3, and cause the potential of the first node d1 to jump from the second potential V2 to the initial potential V0 according to the third control signal CR3, in which the second potential V2 is less than the first potential V1 and greater than the initial potential V0; and the output sub-circuit 20 is configured to receive a first clock signal CLKE, and output an output signal OUT with a chamfer according to the first clock signal CLKE and the potential of the first node d1.

In this embodiment, during a period in which a high potential of the first clock signal CLKE overlaps with a high potential of the second control signal CR2, a potential of the output signal OUT gradually decreases. That is, when the second control signal CR2 is at a high potential, the chamfering sub-circuit 30 causes the potential of the first node d1 to gradually decrease to the second potential V2 according to the second control signal CR2, and when the first clock signal CLKE is at a high potential and the output sub-circuit 20 outputs the output signal OUT with a chamfer according to the first clock signal CLKE and the potential of the first node d1, the larger a width of the overlapping portion between the high potential of the first clock signal CLKE and the high potential of the second control signal CR2 is, the larger a width of the chamfer will be.

For example, in practical applications of the shift register circuit 100, firstly, the input sub-circuit 10 can receive the first control signal CR1, and cause the potential of the first node d1 to jump from the initial potential V0 to the first potential V1 according to the first control signal CR1. Then, the chamfering sub-circuit 30 receives the second control signal CR2 and the third control signal CR3, causes the potential of the first node d1 to gradually decrease from the first potential V1 to the second potential V2 according to the second control signal CR2, and causes the potential of the first node d1 to jump from the second potential V2 to the initial potential V0 according to the third control signal CR3. In the process in which the potential of the first node d1 gradually decreases from the first potential V1 to the second potential V2, the output sub-circuit 20 receives the first clock signal CLKE, and outputs the output signal OUT with a chamfer according to the first clock signal CLKE and the potential of the first node d1.

That is, in this embodiment, the potential of the first node d1 does not directly jump from a high voltage to a low voltage, but jumps from the initial potential V0 to the first potential V1 first, and then gradually decreases from the first potential V1 to the second potential V2; in the process in which the potential of the first node d1 gradually decreases from the first potential V1 to the second potential V2, the output sub-circuit 20 outputs the output signal OUT with a chamfer according to the first clock signal CLKE and the potential of the first node d1, thus preventing the output signal OUT from jumping directly from a high level to a low level.

Figure 2:
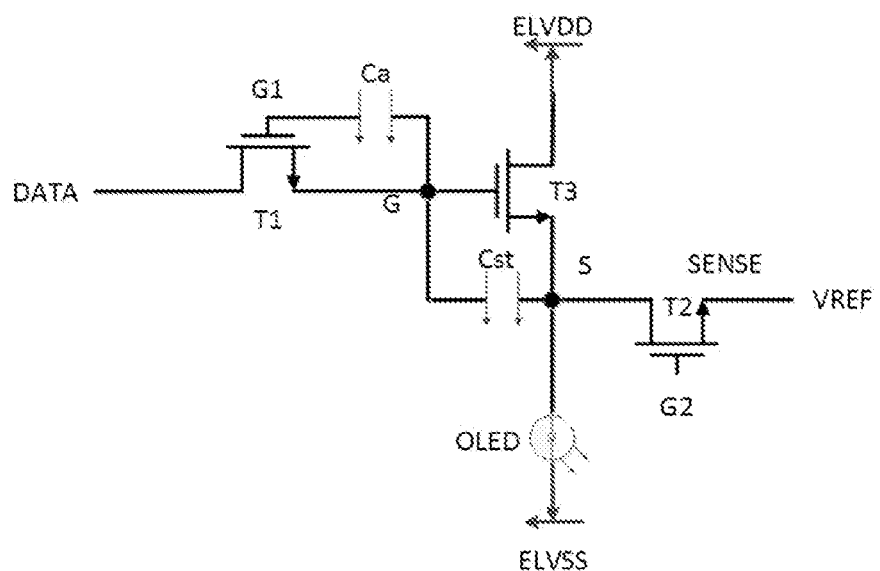
FIG. 2 is a schematic structural diagram of a common 3T1C pixel circuit.

As shown in FIG. 2, a common pixel circuit includes three TFTs and a storage capacitor Cst. When the shift register circuit 100 is used in the pixel circuit shown in FIG. 2, the output signal OUT of the shift register circuit 100 has a chamfer, so the output of a gate potential G1 driving a thin film transistor T1 can be prevented from directly jumping from a high level to a low level.

In the shift register circuit of this embodiment, according to the first control signal and the second control signal, the potential of the first node first jumps from the initial potential to the first potential, and then gradually decreases from the first potential to the second potential, thus avoiding the phenomenon of jump of the output signal caused by excessive change of the potential of the first node, so that the output sub-circuit outputs the output signal with a chamfer, which avoids direct jump of the gate potential signal of the pixel circuit from a high level to a low level.

In an embodiment of the present disclosure, the output sub-circuit 20 is further configured to, according to the first clock signal CLKE and the potential of the first node d1, generate the output signal OUT and cause the potential of the first node d1 to jump from the first potential V1 to a third potential V3, in which the third potential V3 is greater than the first potential V1; and the chamfering sub-circuit 30 is configured to cause the third potential of the first node d1 to gradually decrease to a fourth potential V4 according to the second control signal CR2 so that the potential of the output signal OUT gradually decrease, and cause the potential of the first node d1 to jump from the fourth potential V4 to the initial potential V0 according to the third control signal CR3, in which the fourth potential is greater than the initial potential and less than the third potential.

For example, after the input sub-circuit 10 causes the potential of the first node d1 to jump from the initial potential V0 to the first potential V1 according to the first control signal CR1, the output sub-circuit 20 can also cause the potential of the first node d1 to jump from the first potential V1 to the third potential V3 according to the first clock signal CLKE and the potential of the first node d1, and then the chamfering sub-circuit 30 causes the potential of the first node d1 to gradually decrease from the third potential V3 to the fourth potential V4 according to the second control signal CR2, and causes the potential of the first node d1 to jump from the fourth potential V4 to the initial potential V0 according to the third control signal CR3. The fourth potential V4 may be equal to or not equal to the first potential V1.

In this embodiment, during the period in which the high potential of the first clock signal CLKE overlaps with the high potential of the second control signal CR2, the potential of the output signal OUT gradually decreases. That is, when the second control signal CR2 is at a high potential and the chamfering sub-circuit 30 causes the potential of the first node d1 to gradually decrease from the third potential V3 to the fourth potential V4 according to the second control signal CR2, the potential of the output signal OUT also gradually decreases, that is, a waveform of the output signal OUT has a chamfer, and the larger a width of the overlapping portion of the high potential of the first clock signal CLKE and the high potential of the second control signal CR2 is, the longer the time during which the potential of the output signal OUT gradually decreases will be.

It should be noted that the first control signal CR1, the second control signal CR2, the third control signal CR3, and the first clock signal CLKE in this embodiment each have a corresponding high-level signal (having a high potential) and a low-level signal (having a low potential). The high-level signal and the low-level signal are relative terms. The high-level signal has a higher potential, such as 10V, 15V, and multiple high-level signals may be the same and different from each other. Similarly, the low-level signal has a lower potential, such as −5V, −10V, and multiple low-level signals may be the same and different from each other.

For example, a working process of the shift register circuit 100 in one cycle may be divided into four time periods, which will be described below with reference to FIG. 3.

In a first time period t1, the input sub-circuit 10 receives the first control signal CR1, which is a high-level signal, and causes the potential of the first node d1 to jump from the initial potential V0 to the first potential V1 according to the first control signal CR1.

In a second time period t2, according to the first clock signal CLKE and the potential of the first node d1, the output sub-circuit 20 generates the output signal OUT and causes the potential of the first node d1 to jump from the first potential V1 to the third potential V3. The first clock signal CLKE is a high-level signal.

In a third time period t3, the chamfering sub-circuit 30 causes the potential of the first node d1 to gradually decrease from the third potential V3 to the fourth potential V4 according to the second control signal CR2, and in the process in which the potential of the first node d1 gradually decreases from the third potential V3 to the fourth potential V4, the potential of the output signal OUT generated by the output sub-circuit 20 according to the first clock signal CLKE and the potential of the first node d1 gradually decreases, so that the waveform of the output signal OUT has a chamfer. The second control signal CR2 is a high-level signal, and the first clock signal CLKE is a high-level signal.

In a fourth time period t4, the chamfering sub-circuit 30 causes the potential of the first node d1 to jump from the fourth potential V4 to the initial potential V0 according to the third control signal CR3. The third control signal CR3 is a high-level signal.

In the shift register circuit of this embodiment, in the process in which the chamfering sub-circuit 30 causes the potential of the first node d1 to gradually decrease from the third potential V3 to the fourth potential V4, the output sub-circuit 20 outputs the output signal OUT with a chamfer according to the first clock signal CLKE and the potential of the first node d1, thus avoiding the phenomenon of jump of the output signal OUT caused by excessive change of the potential of the first node.

Figure 5:
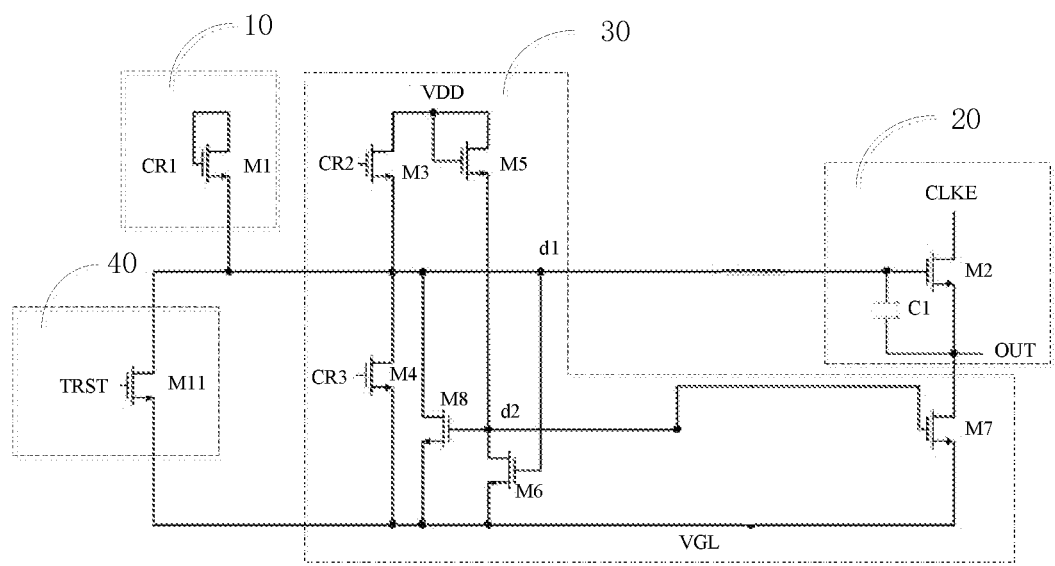
FIG. 5 is a schematic structural diagram of a shift register circuit according to an example of the present disclosure.

In an embodiment of the present disclosure, as shown in FIG. 5, the input sub-circuit 10 may include a first transistor M1, in which a gate of the first transistor M1 is connected for receiving the first control signal CR1, a first electrode of the first transistor M1 is connected to the gate of the first transistor M1, and a second electrode of the first transistor M1 is connected to the first node d1.

In an example, referring to FIG. 5, the output sub-circuit 20 may include a second transistor M2 and a first capacitor C1. A gate of the second transistor M2 is connected to the first node d1, a first electrode of the second transistor M2 is connected for receiving the first clock signal CLKE, and a second electrode of the second transistor M2 serves as an output terminal of the shift register circuit 100 for outputting the output signal OUT with a chamfer; one terminal of the first capacitor C1 is connected to the gate of the second transistor M2, and the other terminal of the first capacitor C1 is connected to the second electrode of the second transistor M2.

Further, referring to FIG. 5, the chamfering sub-circuit 30 may include a third transistor M3, a fourth transistor M4, a fifth transistor M5, a sixth transistor M6, and a seventh transistor M7.

A gate of the third transistor M3 is connected for receiving the second control signal CR2, a first electrode of the third transistor M3 is connected for receiving a first reference voltage VDD, and a second electrode of the third transistor M3 is connected to the first node d1; a gate of the fourth transistor M4 is configured to receive the third control signal CR3, a first electrode of the fourth transistor M4 is connected to the first node d1, and a second electrode of the fourth transistor M4 is connected for receiving a second reference voltage VGL; a first electrode and a gate of the fifth transistor M5 are both connected to the first electrode of the third transistor M3; a gate of the sixth transistor M6 is connected to the first node d1, a first electrode of the sixth transistor M6 is connected to the second electrode of the fifth transistor M5 to form a second node d2, and a second electrode of the sixth transistor M6 is connected for receiving the second reference voltage VGL; a gate of the seventh transistor M7 is connected to the second node d2, a first electrode of the seventh transistor M7 is connected to the second electrode of the second transistor M2, and a second electrode of the seventh transistor M7 is connected for receiving the second reference voltage VGL.

Still further, referring to FIG. 5, the chamfering sub-circuit 30 may further include an eighth transistor M8, in which a gate of the eighth transistor M8 is connected to the second node d2, a first electrode of the eighth transistor M8 is connected to the first node d1, and a second electrode of the eighth transistor M8 is connected for receiving the second reference voltage VGL.

It should be noted that a signal of the first reference voltage VDD in this example is a DC high-level signal, and a signal of the second reference voltage VGL is a DC low-level signal. The first transistor M1 to the eighth transistor M8 may each be a thin film transistor, in which the first electrodes thereof may be sources or drains, and the second electrodes thereof may be drains or gates.

For example, a working process of the shift register circuit 100 in this example will be described below with reference to FIGS. 3 to 5.

In the first time period t1, the first control signal CR1 is a high-level signal, and the first transistor M1 receives the first control signal CR1 to cause the potential of the first node d1 to jump from the initial potential V0 to the first potential V1 according to the first control signal CR1.

In the second time period t2, the first clock signal CLKE is a high-level signal, and the second transistor M2 receives the first clock signal CLKE to generate a high-level output signal OUT and cause the potential of the first node d1 to jump from the first potential V1 to the third potential V3 according to the first clock signal CLKE and the potential of the first node d1.

In the third time period t3, the second control signal CR2 is a high-level signal, the first clock signal CLKE is a high-level signal, and the third transistor M3 further causes the potential of the first node d1 to gradually decrease from the third potential V3 to the fourth potential V4 according to the second control signal CR2. In a process in which the potential of the first node d1 gradually decreases from the third potential V3 to the fourth potential V4, the potential of the output signal OUT output by the second transistor M2 according to the first clock signal CLKE and the potential of the first node d1 gradually decreases.

In the fourth time period t4, the third control signal CR3 is a high-level signal, and the fourth transistor M4 further causes the potential of the first node d1 to jump from the fourth potential V4 to the initial potential V0 according to the third control signal CR3.

Figure 3:
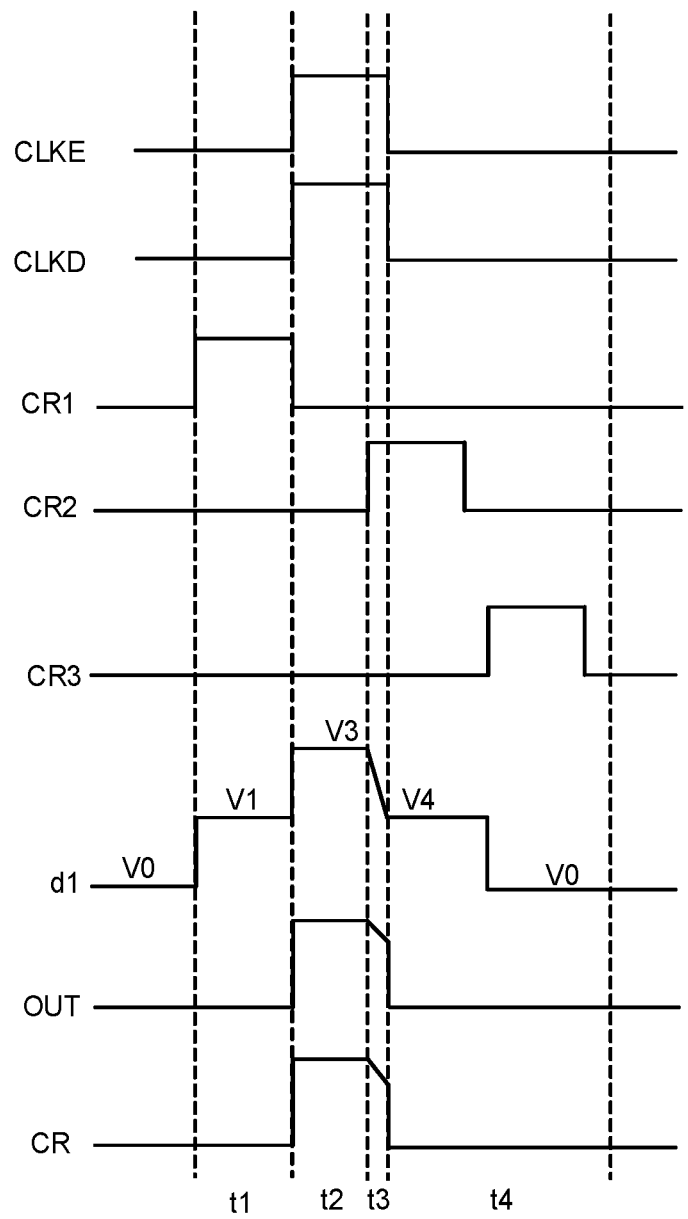
FIG. 3 is a timing diagram of a working process of a shift register circuit according to an embodiment of the present disclosure.
Figure 4:
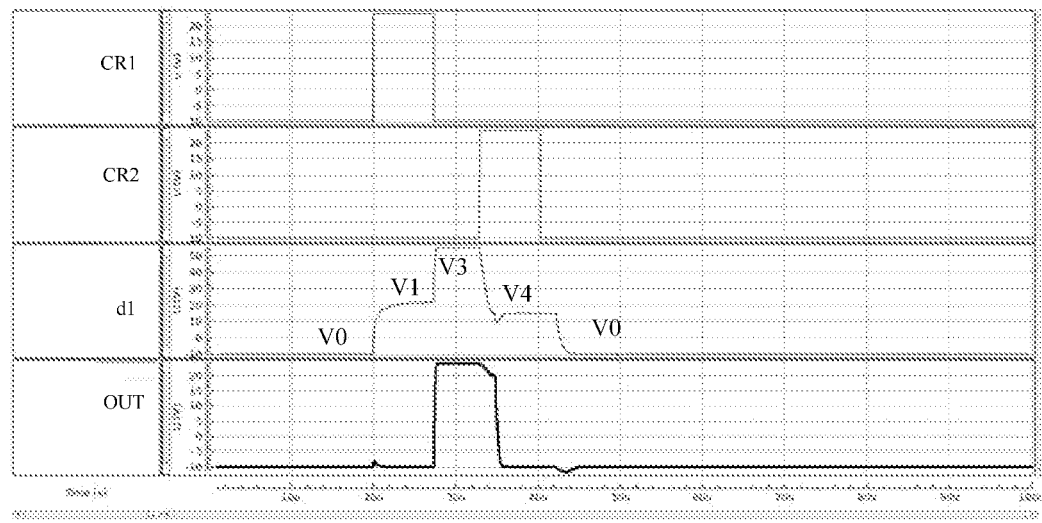
FIG. 4 is a simulation result diagram of part of the signal timing diagram of FIG. 3.

Referring to FIGS. 3 and 4, it can be seen that when the output signal OUT decreases from a high level to a low level, there is an obvious chamfer, rather than a direct jump from the high level to the low level. As a result, an adverse effect caused by direct jump of the output signal can be avoided.

Figure 6:
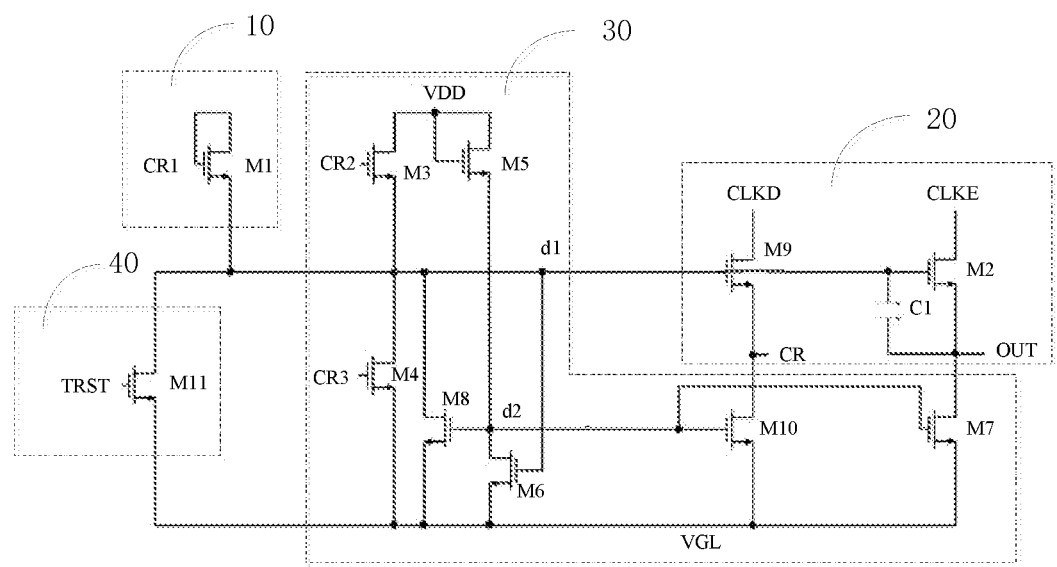
FIG. 6 is a schematic structural diagram of a shift register circuit according to another example of the present disclosure.

In an example of the present disclosure, as shown in FIG. 6, the output sub-circuit 20 may further include a ninth transistor M9, in which a gate of the ninth transistor M9 is connected to the first node d1, a first electrode of the ninth transistor M9 is connected for receiving a second clock signal CLKD, and a second electrode of the ninth transistor M9 serves as a control output terminal of the shift register circuit 100 for outputting a control output signal CR of the shift register circuit 100; and the chamfering sub-circuit 30 may further include a tenth transistor M10, in which a gate of the tenth transistor M10 is connected to the second node d2, a first electrode of the tenth transistor M10 is connected to the second electrode of the ninth transistor M9, and a second electrode of the tenth transistor M10 is connected for receiving the second reference voltage VGL.

It should be noted that the ninth transistor M9 and the tenth transistor M10 in this example may each be a thin film transistor, in which the first electrodes thereof may be sources or drains, and the second electrodes thereof may be drains or gates.

For example, a working process of the shift register circuit 100 in this example will be described below with reference to FIGS. 3, 4 and 6.

In the first time period t1, the first control signal CR1 is a high-level signal, and the first transistor M1 receives the first control signal CR1 to cause the potential of the first node d1 to jump from the initial potential V0 to the first potential V1 according to the first control signal CR1.

In the second time period t2, the first clock signal CLKE and the second clock signal CLKD are both high-level signals, and the second transistor M2 receives the first clock signal CLKE to, according to the first clock signal CLKE and the potential of the first node d1, generate the output signal and cause the potential of the first node d1 to jump from the first potential V1 to the third potential V3; and the ninth transistor receives the second clock signal CLKD to, according to the second clock signal CLKD and the potential of the first node d1, generate the control output signal CR, which is a high-level signal.

In the third time period t3, the second control signal CR2 is a high-level signal, the first clock signal CLKE and the second clock signal CLKD are both high-level signals, and the third transistor M3 further causes the potential of the first node d1 to gradually decrease from the third potential V3 to the fourth potential V4 according to the second control signal CR2. In a process in which the potential of the first node d1 gradually decreases from the third potential V3 to the fourth potential V4, the potential of the output signal OUT output by the second transistor M2 according to the first clock signal CLKE and the potential of the first node d1 gradually decreases; and the potential of the control output signal CR output by the ninth transistor M9 according to the second clock signal CLKD and the potential of the first node d1 also gradually decreases, so that the waveform of the control output signal CR has a chamfer.

In the fourth time period t4, the third control signal CR3 is a high-level signal, and the fourth transistor M4 further causes the potential of the first node d1 to jump from the fourth potential V4 to the initial potential V0 according to the third control signal CR3; and the ninth transistor M9 outputs the control output signal CR according to the second clock signal CLKD (having a low level) and the fourth potential V4 of the first node d1, in which the control output signal CR is a low-level signal.

It should be noted that the first clock signal CLKE, the second clock signal CLKD, the first reference voltage VDD and the second reference voltage VGL in the examples of the present disclosure may each be an external control signal, and the first control signal CR1, the second control signal CR2 and the third control signal CR3 may be determined according to the control output signal CR.

For example, multiple shift register circuits 100 in this example may be cascaded in stages to obtain a gate drive circuit, that is, the gate drive circuit includes multiple stages of the shift register circuits 100 in this example, in which the first control signal CR1, the second control signal CR2 and the third control signal CR3 of the $N^{th}$-stage of shift register circuit are the control output signals CR of the $(N-4)^{th}$-stage of shift register circuit, the $(N+3)^{th}$-stage of shift register circuit and the $(N+8)^{th}$-stage of shift register circuit, respectively, where N is an integer larger than 4.

It can also be said that the first control signal CR1 may be the control output signal CR<N−4>, the second control signal CR2 may be the control output signal CR<N+3>, the third control signal CR3 may be the control output signal CR<N+8>, and the control output signal CR of the shift register circuit 100 is CR<N>.

Therefore, the first control signal, the second control signal, the third control signal and the first clock signal cause the waveform of the output signal of the shift register circuit to have an obvious chamfer, which avoid an adverse effect caused by direct jump of the output signal.

In an embodiment of the present disclosure, referring to FIGS. 5 and 6, the shift register circuit 100 may further include a reset sub-circuit 40. The reset sub-circuit 40 includes an eleventh transistor M11, in which a gate of the eleventh transistor M11 is connected for receiving a reset signal TRST, a first electrode of the eleventh transistor M11 is connected to the first node d1, and a second electrode of the eleventh transistor M11 is connected for receiving the second reference voltage VGL.

The eleventh transistor M11 in this embodiment may be a thin film transistor, in which the first electrode thereof may be a source or a drain, and the second electrode thereof may be a drain or a gate.

For example, the first node d1 may be reset by the eleventh transistor M11 according to the reset signal TRST. The reset signal TRST may be an external control signal.

To sum up, in the shift register circuit of the embodiment of the present disclosure, the chamfering sub-circuit thereof controls the potential of the first node d1 according to the second control signal, so that the output signal output by the output sub-circuit according to the first clock signal and the potential of the first node has a chamfer, thereby avoiding the phenomenon of jump of the output signal caused by the excessive change of the potential of the first node, and preventing the gate potential signal of the pixel circuit from directly jumping from a high level to a low level.

Based on the same idea, an embodiment of the present disclosure provides a drive method for a shift register circuit.

Figure 7:
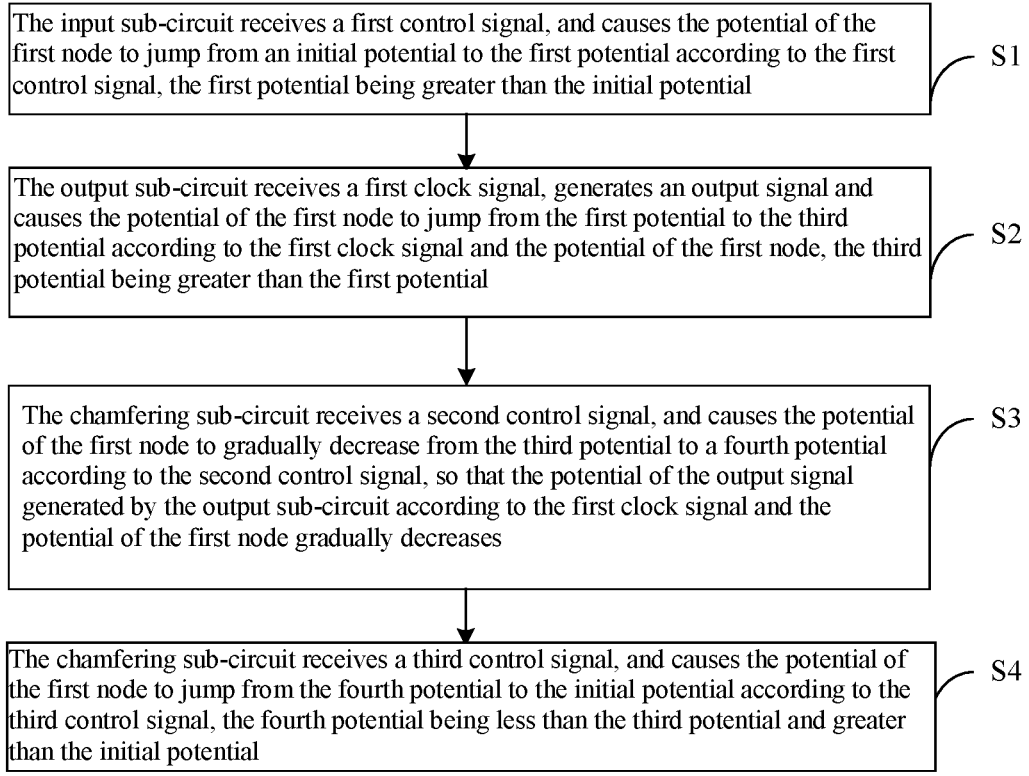
FIG. 7 is a flowchart of a drive method for a shift register circuit according to an embodiment of the present disclosure.

FIG. 7 is a flowchart of a drive method for a shift register circuit according to an embodiment of the present disclosure.

The drive method for a shift register circuit is used to drive the shift register circuit 100 of the above-mentioned embodiments of the present disclosure. As shown in FIG. 7, the drive method for the shift register circuit includes the following steps:

S1: the input sub-circuit receiving a first control signal, and causing the potential of the first node to jump from an initial potential to the first potential according to the first control signal, the first potential being greater than the initial potential;

S2: the output sub-circuit receiving a first clock signal, generating an output signal and causing the potential of the first node to jump from the first potential to the third potential according to the first clock signal and the potential of the first node, the third potential being greater than the first potential;

S3: the chamfering sub-circuit receiving a second control signal, and causing the potential of the first node to gradually decrease from the third potential to a fourth potential according to the second control signal, so that the potential of the output signal generated by the output sub-circuit according to the first clock signal and the potential of the first node gradually decreases; and S4: the chamfering sub-circuit receiving a third control signal, and causing the potential of the first node to jump from the fourth potential to the initial potential according to the third control signal, the fourth potential being less than the third potential and greater than the initial potential.

For example, when driving the shift register circuit, the input sub-circuit first receives the first control signal, and causes the potential of the first node to jump from the initial potential to the first potential according to the first control signal; then the output sub-circuit receives the first clock signal, and causes the potential of the first node to jump from the first potential to the third potential according to the first clock signal, and the chamfering sub-circuit receives the second control signal, and causes the potential of the first node to gradually decrease from the third potential to the fourth potential according to the second control signal; in a process in which the potential of the first node gradually decreases to the fourth potential, the output sub-circuit outputs the output signal with a chamfer according to the first clock signal and the potential of the first node, and finally the chamfering sub-circuit receives the third control signal, and causes the potential of the first node to jump from the fourth potential to the initial potential according to the third control signal.

It should be noted that for other implementations of the drive method for the shift register circuit of the embodiment of the present disclosure, reference may be made to the above-mentioned implementation of the shift register circuit of the present disclosure, and a repeated description will be omitted herein.

In the drive method for the shift register circuit of the embodiment of the present disclosure, the chamfering sub-circuit controls the potential of the first node according to the second control signal, so that the output sub-circuit outputs the output signal with a chamfer according to the first clock signal and the potential of the first node, thereby avoiding the phenomenon of jump of the output signal caused by the excessive change of the potential of the first node, and preventing the gate potential signal of the pixel circuit from directly jumping from the high level to the low level.

Figure 8:
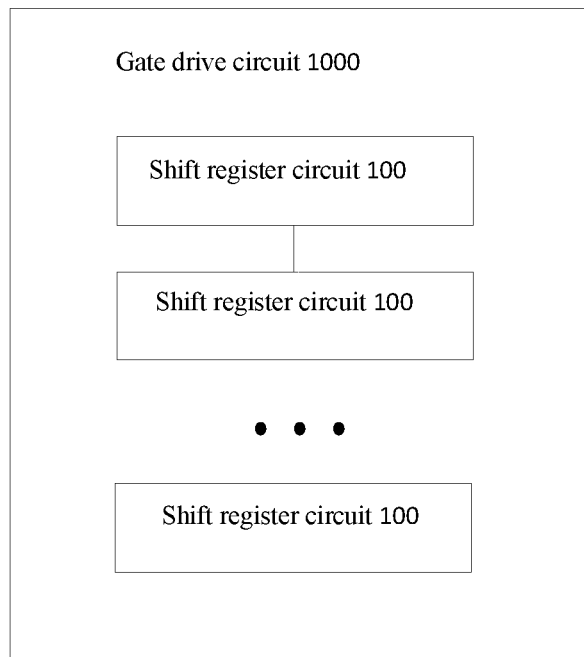
FIG. 8 is a structural block diagram of a gate drive circuit according to an embodiment of the present disclosure.

Based on the same idea, an embodiment of the present disclosure provides a gate drive circuit. FIG. 8 is a structural block diagram of a gate drive circuit according to an embodiment of the present disclosure.

As shown in FIG. 8, the gate drive circuit 1000 includes multiple stages of shift register circuits, and the shift register circuit 100 according to the above-mentioned embodiment of the present disclosure is used as each stage of shift register circuit.

The first control signal CR1, the second control signal CR2 and the third control signal CR3 of the $N^{th}$-stage of shift register circuit 100 are the control output signals CR of the $(N-4)^{th}$-stage of shift register circuit, the $(N+3)^{th}$-stage of shift register circuit and the $(N+8)^{th}$-stage of shift register circuit, respectively, where N is an integer larger than 4.

That is, the first control signal CR1 may be the control output signal CR<N−4>, the second control signal CR2 may be the control output signal CR<N+3>, the third control signal CR3 may be the control output signal CR<N+8>, and the control output signal CR of the shift register circuit 100 is CR<N>.

For example, when the gate drive circuit 1000 is applied to the field of display technology, a gate drive signal may be provided to the pixel circuit shown in FIG. 2 by the gate drive circuit 1000.

In the gate drive circuit of the embodiment of the present disclosure, the shift register circuit of the embodiment of the present disclosure enables the output sub-circuit to output an output signal with a chamfer according to the first clock signal and the potential of the first node, which can avoid the phenomenon of jump of the output signal caused by the excessive change of the potential of the first node, and preventing the gate potential signal of the pixel circuit from directly jumping from a high level to a low level.

Figure 9:
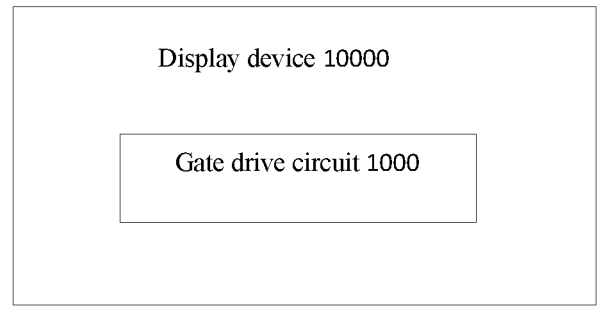
FIG. 9 is a structural block diagram of a display device according to an embodiment of the present disclosure.

Based on the same idea, an embodiment of the present disclosure provides a display device. FIG. 9 is a structural block diagram of a display device according to an embodiment of the present disclosure.

As shown in FIG. 9, the display device 10000 includes the gate drive circuit 1000 of the above-mentioned embodiment of the present disclosure. The display device 10000 may be any product or component with a display function, such as a mobile phone, a tablet computer, a lap-top computer, and a liquid crystal screen.

In the display device of the embodiment of the present disclosure, the shift register circuit of the embodiment of the present disclosure enables the output sub-circuit to output an output signal with a chamfer according to the first clock signal and the potential of the first node, which can avoid the phenomenon of jump of the output signal caused by the excessive change of the potential of the first node, and preventing the gate potential signal of the pixel circuit from directly jumping from a high level to a low level.

In addition, terms "first" and "second" are used for descriptive purposes, which cannot be understood as indicating or implying relative importance or implicitly indicating the number of technical features involved. Therefore, the features defined with "first" and "second" may explicitly or implicitly include at least one said technical feature. In the description of the present disclosure, "multiple" means at least two, such as two, three, etc., unless specifically defined otherwise.

In the present disclosure, unless clearly specified and defined otherwise, terms such as "installation", "connection", "joining", "fixing" should be understood in a broad sense. For example, the "connection" may be a fixed connection or a detachable connection, or an integral connection; it may be a mechanical connection or an electrical connection; it may be a direct connection or an indirect connection implemented through an intermediate medium, and it may also be internal communication between two elements or interaction between two elements, unless specifically defined otherwise. For those skilled in the art, the meaning of the above-mentioned terms in the present disclosure can be understood according to the specific situation.

In the description of this specification, descriptions made by referring to the terms "one embodiment", "some embodiments", "example", "specific example", "some examples" or the like mean that the features, structures, materials or characteristics described with reference to the embodiments or examples are included in at least one embodiment or example of the present disclosure. In this specification, the schematic expressions of the above terms do not necessarily refer to the same embodiment or example. Moreover, the features, structures, materials or characteristics as described may be combined appropriately in any one or more embodiments or examples. In addition, those skilled in the art can combine different embodiments or examples and features of different embodiments or examples described in this specification without contradiction with each other.

Although the embodiments of the present disclosure have been shown and described above, it can be understood that the above-mentioned embodiments are exemplary and should not be construed as limiting the present disclosure. Those skilled in the art can change, modify, replace and vary the above embodiments within the scope of the present disclosure.

The invention claimed is:

1. A shift register circuit, wherein the shift register circuit comprises:
   an input sub-circuit, the input sub-circuit being connected to a first node of the shift register circuit, and being configured to receive a first control signal, and cause a potential of the first node to jump from an initial potential to a first potential according to the first control signal, the first potential being greater than the initial potential;
   an output sub-circuit, the output sub-circuit being connected to the first node of the shift register circuit, and being configured to receive a first clock signal, and generate an output signal and cause the potential of the first node to jump from the first potential to a third potential according to the first clock signal and the potential of the first node, the third potential being greater than the first potential; and
   a chamfering sub-circuit, the chamfering sub-circuit being connected to the first node of the shift register circuit, and being configured to receive a second control signal, cause the potential of the first node to gradually decrease from the third potential to a fourth potential according to the second control signal so that a potential of the output signal gradually decreases, and cause the potential of the first node to jump from the fourth potential to the initial potential according to a third control signal, the fourth potential being greater than the initial potential and less than the third potential;
   wherein the chamfering sub-circuit is configured to cause the potential of the output signal to decrease gradually during a period in which the first clock signal and the second control signal are both at a high potential.

2. The shift register circuit according to claim 1, wherein the input sub-circuit comprises:
   a first transistor, wherein a gate of the first transistor is connected for receiving the first control signal, a first electrode of the first transistor is connected to the gate of the first transistor, and a second electrode of the first transistor is connected to the first node.

3. The shift register circuit according to claim 1, wherein the output sub-circuit comprises:
a second transistor, wherein a gate of the second transistor is connected to the first node, a first electrode of the second transistor is connected for receiving the first clock signal, and a second electrode of the second transistor serves as an output terminal of the shift register circuit for outputting the output signal; and
a first capacitor, wherein one terminal of the first capacitor is connected to the gate of the second transistor, and another terminal of the first capacitor is connected to the second electrode of the second transistor.

4. The shift register circuit according to claim 1, wherein the chamfering sub-circuit comprises:
a third transistor, wherein a gate of the third transistor is connected for receiving the second control signal, a first electrode of the third transistor is connected for receiving a first reference voltage, and a second electrode of the third transistor is connected to the first node;
a fourth transistor, wherein a gate of the fourth transistor is connected for receiving the third control signal, a first electrode of the fourth transistor is connected to the first node, and a second electrode of the fourth transistor is connected for receiving a second reference voltage;
a fifth transistor, wherein a first electrode and a gate of the fifth transistor are both connected to the first electrode of the third transistor;
a sixth transistor, wherein a gate of the sixth transistor is connected to the first node, a first electrode of the sixth transistor is connected to the second electrode of the fifth transistor to form a second node, and a second electrode of the sixth transistor is connected for receiving the second reference voltage; and
a seventh transistor, wherein a gate of the seventh transistor is connected to the second node, a first electrode of the seventh transistor serves as an output terminal of the shift register circuit, and a second electrode of the seventh transistor is connected for receiving the second reference voltage.

5. The shift register circuit according to claim 4, wherein the chamfering sub-circuit further comprises:
an eighth transistor, wherein a gate of the eighth transistor is connected to the second node, a first electrode of the eighth transistor is connected to the first node, and a second electrode of the eighth transistor is connected for receiving the second reference voltage.

6. The shift register circuit according to claim 4, wherein:
the output sub-circuit further comprises a ninth transistor, wherein a gate of the ninth transistor is connected to the first node, a first electrode of the ninth transistor is connected for receiving a second clock signal, and a second electrode of the ninth transistor serves as a control output terminal of the shift register circuit for outputting a control output signal of the shift register circuit; and
the chamfering sub-circuit further comprises a tenth transistor, wherein a gate of the tenth transistor is connected to the second node, a first electrode of the tenth transistor is connected to the second electrode of the ninth transistor, and a second electrode of the tenth transistor is connected for receiving the second reference voltage.

7. The shift register circuit according to claim 1, further comprising a reset sub-circuit, wherein the reset sub-circuit comprises:
an eleventh transistor, wherein a gate of the eleventh transistor is connected for receiving a reset signal, a first electrode of the eleventh transistor is connected to the first node, and a second electrode of the eleventh transistor is connected for receiving a second reference voltage.

8. A drive method for a shift register circuit, which is used to drive the shift register circuit according to claim 1, wherein the method comprises:
in a first time period, receiving, by the input sub-circuit, the first control signal, and causing the potential of the first node to jump from the initial potential to the first potential according to the first control signal, the first potential being greater than the initial potential;
in a second time period, receiving, by the output sub-circuit, the first clock signal, generating the output signal and causing the potential of the first node to jump from the first potential to the third potential according to the first clock signal and the potential of the first node, the third potential being greater than the first potential;
in a third time period, receiving, by the chamfering sub-circuit, a second control signal, and causing the potential of the first node to gradually decrease from the third potential to the fourth potential according to the second control signal, so that the potential of the output signal generated by the output sub-circuit according to the first clock signal and the potential of the first node gradually decreases; and
in a fourth time period, receiving, by the chamfering sub-circuit, the third control signal, and causing the potential of the first node to jump from the fourth potential to the initial potential according to the third control signal, the fourth potential being less than the third potential and greater than the initial potential.

9. A gate drive circuit, wherein the gate drive circuit comprises multiple stages of shift register circuits, wherein the shift register circuit according to claim 1 is used as each stage of shift register circuit.

10. The gate drive circuit according to claim 9, wherein the first control signal, the second control signal and the third control signal of the Nth-stage of shift register circuit are control output signals of the (N−4)th-stage of shift register circuit, the (N+3)th-stage of shift register circuit and the (N+8)th-stage of shift register circuit, respectively, where N is an integer larger than 4.

11. A display device, wherein the display device comprises the gate drive circuit according to claim 9.

12. The shift register circuit according to claim 2, wherein the output sub-circuit comprises:
a second transistor, wherein a gate of the second transistor is connected to the first node, a first electrode of the second transistor is connected for receiving the first clock signal, and a second electrode of the second transistor serves as an output terminal of the shift register circuit for outputting the output signal; and
a first capacitor, wherein one terminal of the first capacitor is connected to the gate of the second transistor, and another terminal of the first capacitor is connected to the second electrode of the second transistor.

13. The shift register circuit according to claim 5, wherein:
the output sub-circuit further comprises a ninth transistor, wherein a gate of the ninth transistor is connected to the first node, a first electrode of the ninth transistor is connected for receiving a second clock signal, and a second electrode of the ninth transistor serves as a control output terminal of the shift register circuit for outputting a control output signal of the shift register circuit; and the chamfering sub-circuit further comprises a tenth transistor, wherein a gate of the tenth transistor is connected to the second node, a first electrode of the tenth transistor is connected to the second electrode of the ninth transistor, and a second electrode of the tenth transistor is connected for receiving the second reference voltage.

\* \* \* \* \*